United States Patent
Iwasaki et al.

(10) Patent No.: US 10,440,868 B2
(45) Date of Patent: Oct. 8, 2019

(54) ROTARY HEAD FOR COMPONENT MOUNTING DEVICE

(71) Applicant: Fuji Corporation, Chiryu (JP)

(72) Inventors: Masataka Iwasaki, Anjo (JP); Takeshi Fujishiro, Toyohashi (JP); Shuhei Yamada, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 275 days.

(21) Appl. No.: 15/127,064

(22) PCT Filed: Mar. 20, 2014

(86) PCT No.: PCT/JP2014/057849
§ 371 (c)(1),
(2) Date: Sep. 19, 2016

(87) PCT Pub. No.: WO2015/140999
PCT Pub. Date: Sep. 24, 2015

(65) Prior Publication Data
US 2017/0099753 A1 Apr. 6, 2017

(51) Int. Cl.
*H05K 13/04* (2006.01)
*B65G 47/91* (2006.01)

(52) U.S. Cl.
CPC ......... *H05K 13/0408* (2013.01); *B65G 47/91* (2013.01); *H05K 13/041* (2018.08); *H05K 13/0409* (2018.08)

(58) Field of Classification Search
CPC ............... B65G 47/91; H05K 13/0408; H05K 13/0409; H05K 13/041
See application file for complete search history.

(56) References Cited

U.S. PATENT DOCUMENTS

| 6,094,808 A * | 8/2000 | Mimura | H05K 13/0452 29/743 |
| 7,302,755 B2 * | 12/2007 | Ricketson | H05K 13/0452 29/743 |
| 7,493,689 B2 * | 2/2009 | Ricketson | H01L 24/74 29/739 |

(Continued)

FOREIGN PATENT DOCUMENTS

| CN | 103025144 A | 4/2013 |
| JP | 2008-147386 A | 6/2008 |

OTHER PUBLICATIONS

International Search Report dated May 27, 2014 in PCT/JP2014/057849 filed Mar. 20, 2014.

*Primary Examiner* — Minh N Trinh
(74) *Attorney, Agent, or Firm* — Oblon, McClelland, Maier & Neustadt, L.L.P.

(57) ABSTRACT

A rotary head includes a rotating body on which a plurality of suction nozzles that suck a component at a tip end are disposed in a circumferential direction, and revolves the plurality of suction nozzles by rotation of the rotating body, in which a wall portion with a wall surface along an axial direction of a rotary axis of the rotating body, is provided on a lower surface of the rotating body, and the wall portion is provided in the vicinity of an inner circumferential side of the plurality of suction nozzles such that a reduction in pressure on the inner circumferential side of the plurality of suction nozzles caused by the revolving of the suction nozzles is suppressed.

9 Claims, 7 Drawing Sheets

(56) References Cited

U.S. PATENT DOCUMENTS

2006/0119118 A1\* 6/2006 Hata .................. H05K 13/0409
                                                    294/183
2008/0135182 A1   6/2008 Nishikawa
2017/0099753 A1\* 4/2017 Iwasaki ............. H05K 13/0408

\* cited by examiner

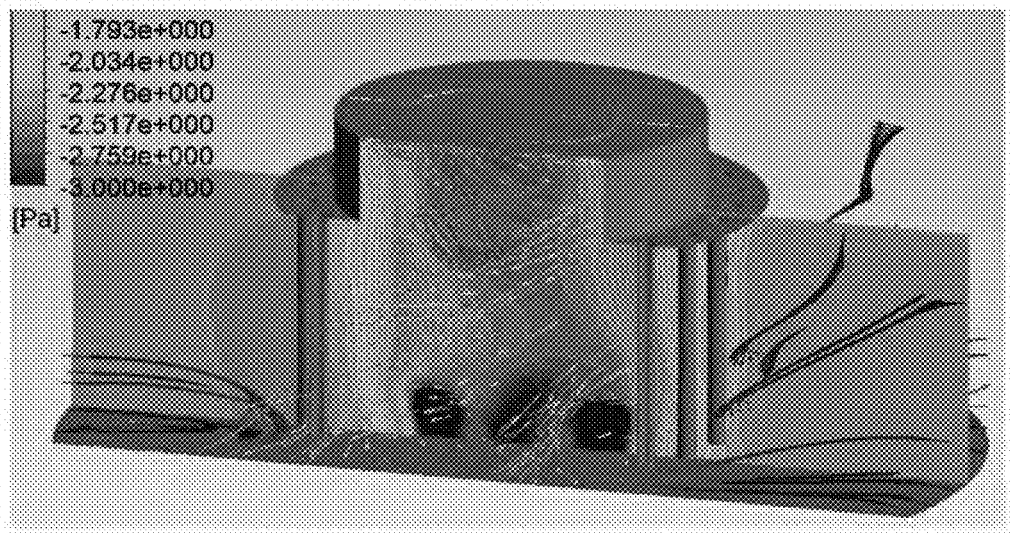
Fig. 7A ANNULAR WALL SECTION NOT PRESENT
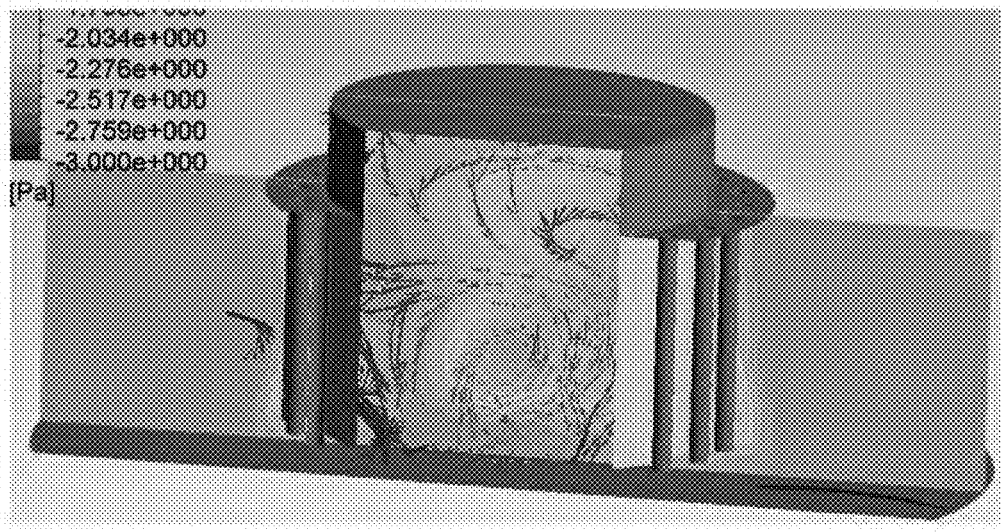
Fig. 7B ANNULAR WALL SECTION PRESENT

ROTARY HEAD FOR COMPONENT MOUNTING DEVICE

TECHNICAL FIELD

The present application relates to a rotary head and a component mounting device.

BACKGROUND ART

In the related art, adherence of dirt or dust to a component or a board is prevented by installing a component mounting device which mounts a sucked component on the board in a clean room. In addition, since dirt or dust is generated by an operation of the component mounting device, countermeasures therefor are carried out. For example, in the component mounting device in PTL 1, adherence to the board of dirt or dust which falls toward the board is prevented by providing an air curtain which blows out air along an upper surface of the board.

CITATION LIST

Patent Literature

PTL 1: JP-A-2008-147386

SUMMARY

As such a component mounting device, there is a component mounting device which is provided with a rotary head on which a plurality of suction nozzles that suck a component are disposed in a circumferential direction, and intermittently rotates the rotary head such that each suction nozzle is sequentially moved on a suction position of the component or on a mounting position of the component. When the plurality of suction nozzles are revolved by intermittently rotating the rotary head, there are cases where an updraft is generated by lowering pressure on an inner circumferential side of the plurality of suction nozzles. In this case, there is a concern that dust or dirt within the component mounting device is wound up by the rotary head, and the dirt or dust that is wound up is dispersed in each portion of the device and adheres to the component or the board.

The main object of a rotary head and a component mounting device of the present disclosure is to suppress the dirt or dust being wound up caused by the rotation of the rotary head.

A rotary head of the present disclosure includes a rotating body on which a plurality of suction nozzles that suck a component at a tip end are disposed in a circumferential direction, and revolves the plurality of suction nozzles by rotation of the rotating body, in which a wall portion with a wall surface along an axial direction of a rotary axis of the rotating body, is provided on a lower surface of the rotating body, and the wall portion is provided in the vicinity of an inner circumferential side of the plurality of suction nozzles such that a reduction in pressure on the inner circumferential side of the plurality of suction nozzles caused by the revolving of the suction nozzles is suppressed.

The rotary head of the present disclosure is provided with the wall portion in the vicinity of the inner circumferential side of the plurality of suction nozzles such that a reduction in pressure on the inner circumferential side of the plurality of suction nozzles caused by the rotation of the rotating body is suppressed. For this reason, it is possible to suppress generation of an updraft toward the rotating body caused by reducing pressure on the inner circumferential side of the plurality of suction nozzles. Accordingly, it is possible to suppress the dirt or dust being wound up caused by the rotation of the rotary head.

In the rotary head of the present disclosure, the wall portion may be formed with a height in which a height from the lower surface of the rotating body does not exceed the tip end of the suction nozzle. By doing so, it is possible to prevent interference of the wall portion with the component which is sucked at the tip end of the suction nozzle. In addition, it is possible to further suppress generation of the updraft since it is possible to bring the wall portion as close as possible to the suction nozzle.

In addition, in the rotary head of the present disclosure, the wall portion may be a cylindrical member which is attached to the lower surface of the rotating body with an axis the same as the rotary axis of the rotating body. By doing so, it is possible to easily provide the wall portion on the lower surface of the rotating body. In addition, it is possible to suppress influence on an operation of the rotary head in the case of providing the wall portion since it is possible to set the wall portion to a relatively light weight.

In addition, in the rotary head of the present disclosure, a background member with a cylindrical shape that is used when the tip end of the suction nozzle is imaged from the side may be attached to the lower surface of the rotating body, and the wall portion may be formed with a height from the lower surface of the rotating body that is lower than the height of the background member, with a larger diameter than an outer diameter of the background member. By doing so, in the case where the wall portion is provided, it is possible to prevent the influence on imaging of the tip end of the suction nozzle.

A component mounting device of the present disclosure is provided with any of the rotary heads described above and a movement device configured to move the rotary head to a supply position at which the component is supplied from a component supply device and a mounting position at which the component is mounted on a mounting target.

In the component mounting device of the present disclosure, it is possible to suppress the dirt or dust being wound up caused by the rotation of the rotary head since any of the rotary heads described above is provided. For this reason, it is possible to prevent dispersion of the dirt and dust that is wound up within the component mounting device accompanying movement of the rotary head.

BRIEF DESCRIPTION OF DRAWINGS

FIGS. 7A and 7B are explanatory diagrams illustrating an example of pressure distribution in a simulation.

DESCRIPTION OF EMBODIMENTS

Figure 1:
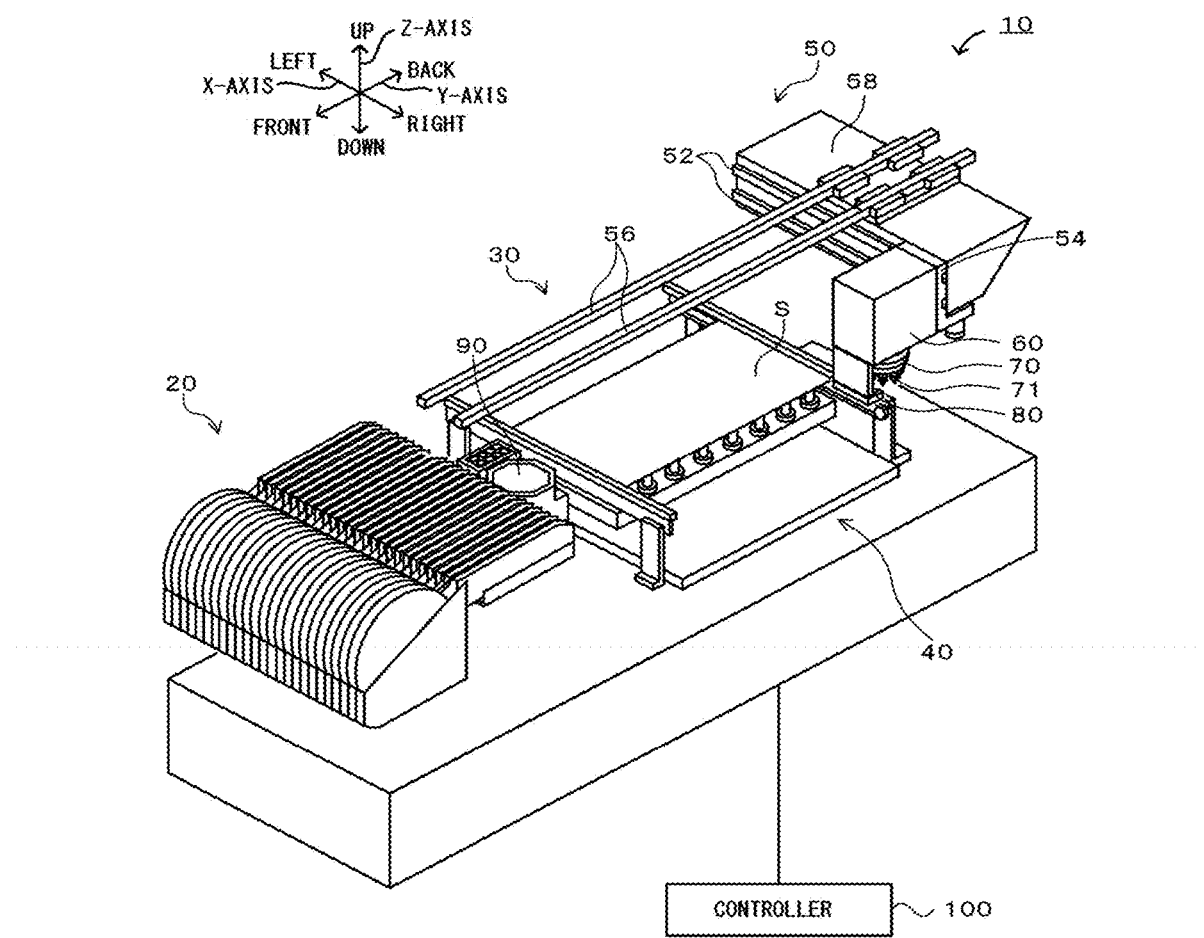
FIG. 1 is a configuration diagram illustrating an outline configuration of a component mounting device 10.
Figure 2:
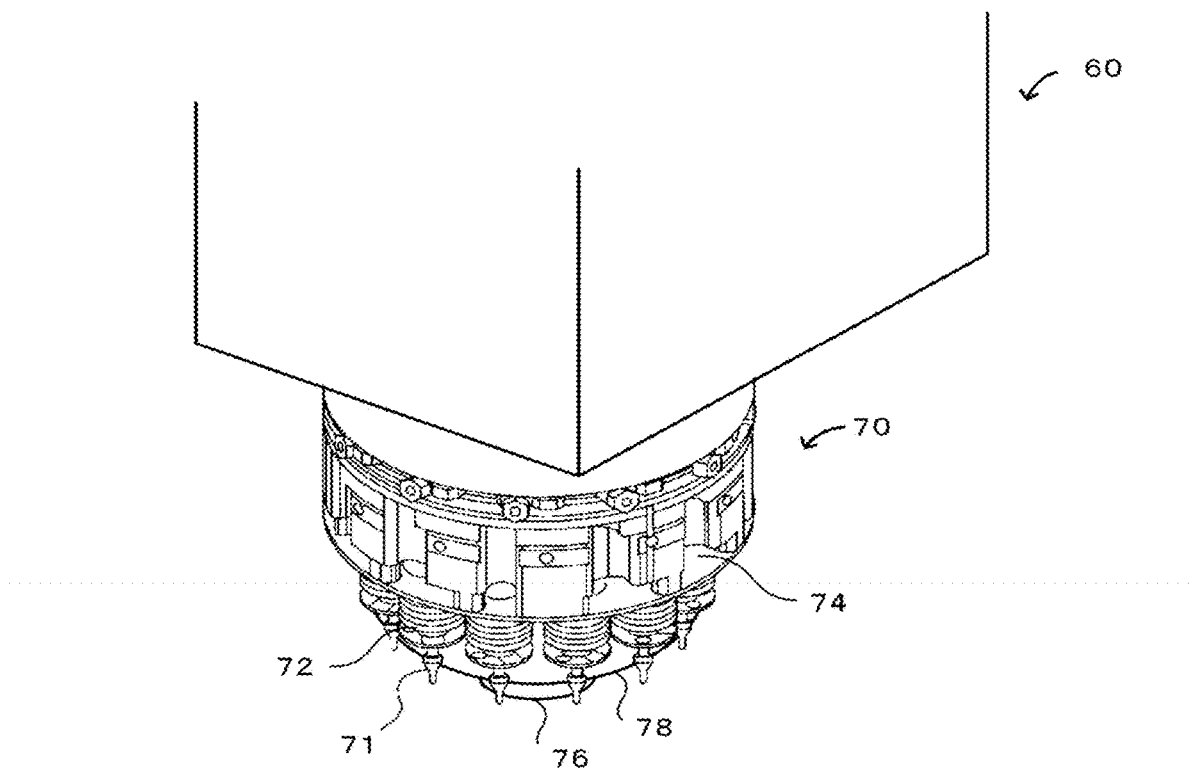
FIG. 2 is a perspective view of a head unit 60.
Figure 3:
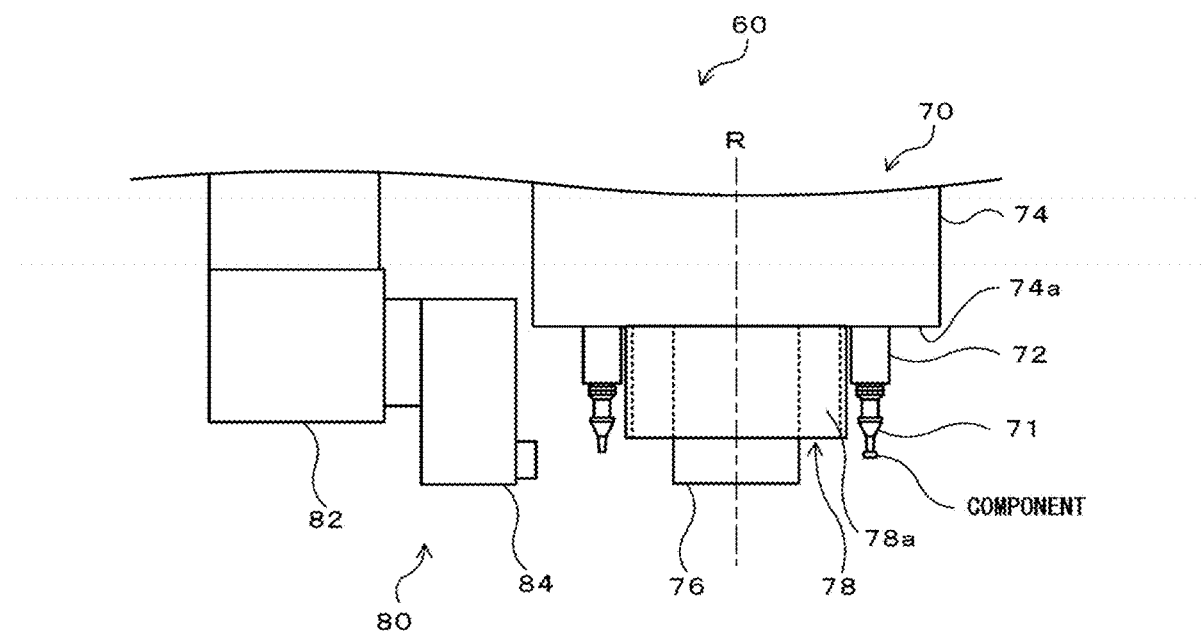
FIG. 3 is a configuration diagram illustrating an outline of a side surface configuration of the head unit 60.
Figure 4:
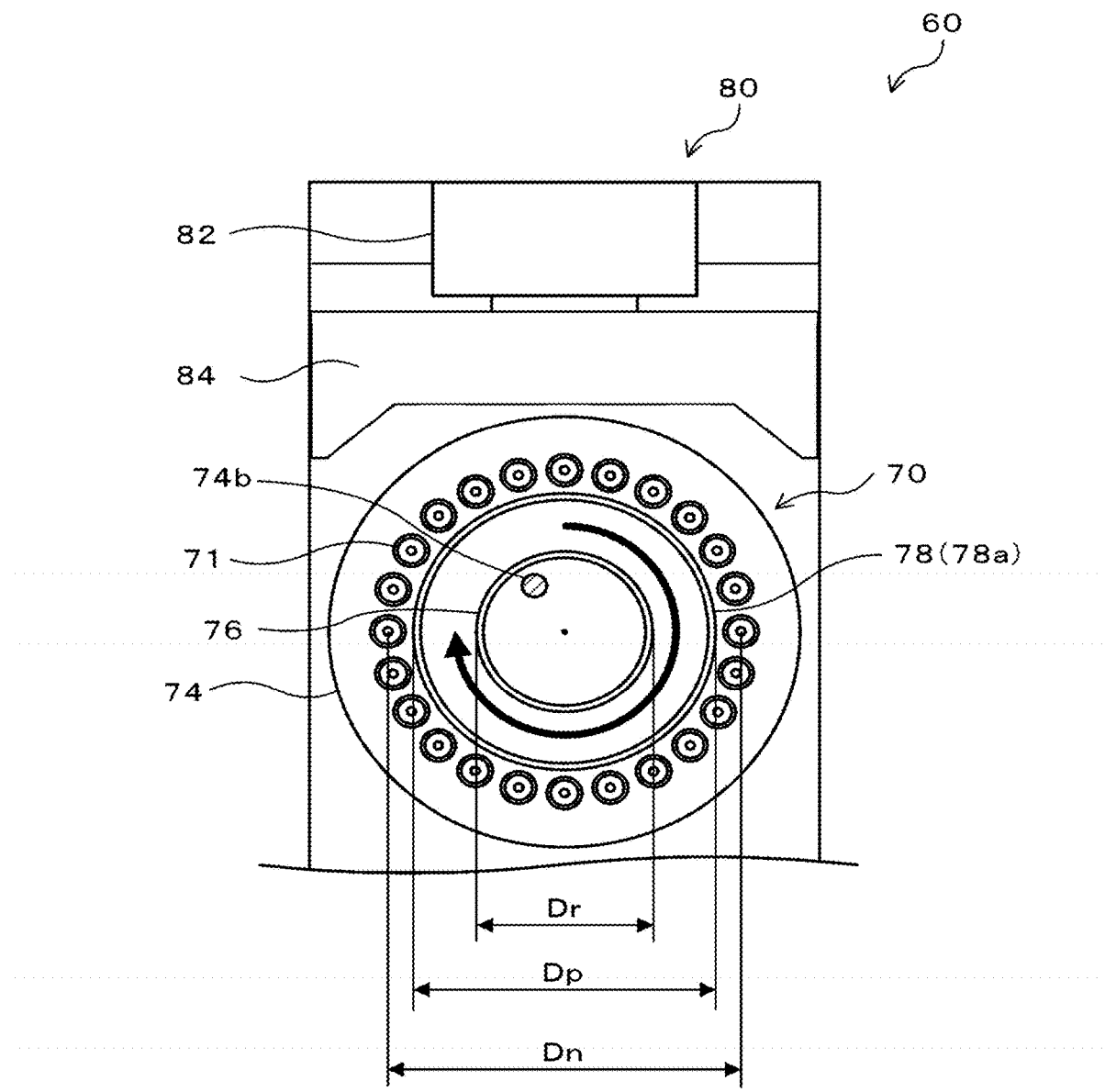
FIG. 4 is a configuration diagram illustrating an outline of a lower surface configuration of the head unit 60.

Next, embodiments of the present disclosure will be described below with reference to the drawings. FIG. 1 is a configuration diagram illustrating an outline configuration of a component mounting device 10, FIG. 2 is a perspective view of a head unit 60, FIG. 3 is a configuration diagram illustrating an outline of a side surface configuration of the head unit 60, and FIG. 4 is a configuration diagram illustrating an outline of a lower surface configuration of the head unit 60.

As shown in FIG. 1, the component mounting device 10 is provided with a component supply device 20 that is provided with a reel and the like in which a component is accommodated, a board conveyance device 30 which transports a board S, a back-up device 40 which backs up the transported board S, a moving mechanism 50 which moves the head unit 60 that sucks the component and mounts the component on the board S, and a controller 100 which controls the entirety of the device. Note that, the component supply device 20 (reel) accommodates the component in a state in which the component is covered by a film, and is in a state in which the component is exposed and able to be sucked when the film is peeled.

The moving mechanism 50 is provided with a guide rail 56 which is provided along the Y-axis direction on an upper section of the device, a Y-axis slider 58 which is movable along the guide rail 56, a guide rail 52 which is provided along the X-axis direction on the side surface of the Y-axis slider 58, and an X-axis slider 54 which is attached to the head unit 60 which is movable along the guide rail 52.

The head unit 60 is provided with a rotary head 70 on which a plurality of shaft shape suction nozzles 71 are disposed at an interval of a predetermined angle in the circumferential direction (on the circumference with the center axis the same as the rotary axis), and a side camera 80 which images the tip end of the suction nozzle 71 from the side. As shown in FIG. 4, in the present embodiment, the rotary head 70 on which 24 suction nozzles 71 are disposed at an interval of 15 degrees is illustrated, but it is sufficient if a plurality of suction nozzles 71 are disposed, and 12 suction nozzles 71 may be disposed at an interval of 30 degrees, for example. Note that, illustration of the side camera 80 is omitted from FIG. 2.

As shown in FIG. 3, the rotary head 70 is provided with a plurality (24) of nozzle holders 72 that respectively hold the plurality of suction nozzles 71, a rotating body 74 to which the nozzle holder 72 is attached and which rotates about a rotary axis R due to a driving motor that is not illustrated, a fluorescent member 76 to which a fluorescent coating material that receives ultraviolet light and emits light is colored, and an annular wall section 78 that separates a region in which the plurality of suction nozzles 71 are disposed (annular shaped region) and a region on the inner circumferential side of the plurality of suction nozzles 71 (hereinafter referred to as "nozzle inner circumferential side"). The rotating body 74 is configured so as to be able to intermittently rotate by a predetermined angle (15 degrees), and each suction nozzle 71 is revolved by the predetermined angle in the circumferential direction by rotation of the rotating body 74. In addition, although illustration is omitted, the rotary head 70 is provided with a Z-axis actuator which moves the nozzle holder 72 in the Z-axis direction and a θ axis actuator which rotates the nozzle holder 72 about the axis. For this reason, the plurality of suction nozzles 71 are able to be moved in the Z-axis direction and rotated about the axis.

The fluorescent member 76 is a cylindrical member that is attached to a lower surface 74a of the rotating body 74 with an axis the same as the rotary axis R. Since the fluorescent member 76 functions as a background when the tip end of the suction nozzle 71 is imaged by the side camera 80, the fluorescent member 76 is formed with an outer diameter Dr in consideration of a positional relationship with the imaged suction nozzle 71, a distance from an irradiation section described later, a size that is able to secure a necessary amount of light emission, and the like. In addition, the fluorescent member 76 is formed with a height (height below the component) at which the height from the lower surface 74a of the rotating body 74 exceeds a lower surface of the component that is mounted on the tip end of the suction nozzle 71. Here, a fiducial mark 74b is provided on the lower surface 74a of the rotating body 74. The fluorescent member 76 is formed with an inner diameter that is larger than the distance from the center of the lower surface 74a to the fiducial mark 74b.

The annular wall section 78 is a cylindrical member that is attached to the lower surface 74a of the rotating body 74 with an axis the same as the rotary axis R, and an outer wall surface 78a is in a direction along the axis direction of the rotary axis R. In addition, since the annular wall section 78 is formed at a height that does not exceed the tip end of the suction nozzle 71 (height that is not below the tip end), the height of the annular wall section 78 from the lower surface 74a of the rotating body 74 is lower than the height of the fluorescent member 76. In addition, an outer diameter Dp of the annular wall section 78 is larger than the outer diameter Dr of the fluorescent member 76, and is a diameter that does not interfere with the suction nozzle 71 or the sucked component. Here, when the distance in the diameter direction between suction nozzles 71 disposed on opposite sides of the circumference is a distance between nozzles Dn, the outer diameter Dp of the annular wall section 78 is preferably a diameter of approximately 70% or more of the distance between nozzles Dn. The outer diameter Dp of the annular wall section 78 in the present embodiment is formed with a diameter that is an upper limit in a range that does not interfere with the suction nozzle 71 or the sucked component such that the outer wall surface 78a is positioned in the vicinity of the plurality of suction nozzles 71.

The side camera 80 is configured by a camera main body 82 which is attached to the lower portion of the head unit 60 and an optical system unit 84 which forms an optical path to the camera body 82. The optical system unit 84 is provided with the irradiation section which is not illustrated, and irradiates ultraviolet light from the irradiation portion toward the fluorescent member 76. When the fluorescent member 76 receives the ultraviolet light and emits light, light except for light that is blocked by the suction nozzle 71 or the component that is at the predetermined imaging position enters the optical system unit 80, and is led to the camera main body 82 through the optical path of the optical system unit 80. Thereby, the camera main body 82 is able to image the suction nozzle 71 or the component that is at the predetermined imaging position. Note that, the predetermined imaging position is a position immediately prior to mounting of the component, a position immediately after mounting of the component, or the like. The controller 100 determines whether or not the component is in a mountable posture based on an image at the position immediately prior to mounting imaged by the side camera 80 and determines presence or absence of takeout of the component based on an image at the position immediately after mounting imaged by the side camera 80.

In addition, the component mounting device 10 is provided with a parts camera 90 and the like for imaging the component that is sucked by the suction nozzle 71 from below. The controller 100 detects an amount of positional deviation of the component that is sucked by each suction nozzle 71 based on an image which is imaged by the parts camera 90 and calculates an amount of correction with respect to the mounting position when the component is mounted. Note that, the parts camera 90 is also able to image the fiducial mark 74*b* that is provided on the lower surface 74*a* of the rotating body 74, and the controller 100 performs image processing with reference to the fiducial mark 74*b* within the image.

The controller 100 controls the component mounting device 10 upon reception of a command from a management device, which is not illustrated, that manages a production job of the board S. The production job specifies which components are mounted in which order on which board S, how many boards are to be subjected to mounting operation, and the like by the component mounting device 10.

Next, the component mounting device 10 is described concerning the mounting operation in which the components are mounted on the board S based on the production job. First, the controller 100 controls the moving mechanism 50 such that the head unit 60 is moved on the supply position to which the component is supplied from the component supply device 20, and moves each suction nozzle 71 up to the supply position in the Z-axis direction and sucks the component while intermittently rotating the rotating body 74 of the rotary head 70 and sequentially revolving each suction nozzle 71. When each suction nozzle 71 sucks the component, the controller 100 controls the moving mechanism 50 such that the head unit 60 is moved on the board S via the parts camera 90. Then, the controller 100 controls the moving mechanism 50 such that the head unit 60 is moved on the mounting position at which the component is mounted on the board S is mounted, and moves each suction nozzle 71 up to the mounting position in the Z-axis direction and mounts the component on the board S while intermittently rotating the rotating body 74 of the rotary head 70 and sequentially revolving each suction nozzle 71. Note that, the controller 100 performs correction based on the amount of correction that is calculated from the imaged image of the parts camera 90 with respect to the mounting position at which the component is mounted.

In this manner, during component mounting on the board S, the rotating body 74 of the rotary head 70 is repeatedly intermittently rotated and the plurality of suction nozzles 71 (nozzle holders 72) are repeatedly revolved. Here, when the plurality of suction nozzles 71 are revolved, there are cases in which the nozzle inner circumferential side has negative pressure due to generation of rotational flow about the suction nozzle 71. In particular, in recent years, in order to improve mounting efficiency of the component mounting device 10, rotational speed of the rotating body 74 has increased. For this reason, there are cases in which pressure on the nozzle inner circumferential side is greatly lowered, air is drawn in strongly, and an updraft is generated toward the rotating body 74. As described above, the component supply device 20 enables the component to be sucked by peeling the film that covers the component, and therefore, dirt and dust such as minute film pieces or paper pieces that are generated when the film is peeled and the like is present around the supply position. Accordingly, when the updraft is generated, dirt and dust is wound up by the rotary head 70. When the wound up dirt and dust adheres to the suction nozzle 71 and the component is imaged by the parts camera 90, there are cases in which the dirt and dust is reflected on the image with the component, and component recognition by the controller 100 is hindered. In addition, when the wound up dirt and dust adheres to the fiducial mark 74*b* that is provided on the lower surface 74*a* of the rotating body 74, there are cases in which, since the fiducial mark 74*b* is made dirty, the controller 100 erroneously recognizes the fiducial mark 74*b*, and an image processing error is generated. In this case, there are cases in which the controller 100 does not appropriately calculate the amount of correction based on the image and mounting precision of the component is lowered. Furthermore, when the head unit 60 moves from the supply position to the mounting position, there are cases in which the wound up dirt and dust is dispersed within the component mounting device 10 and adheres to the board S or the mounted component.

In contrast to this, the rotary head 70 in the present embodiment is provided with the annular wall section 78, therefore, even if the plurality of suction nozzles 71 are revolved, it is possible to suppress reduction of pressure on the nozzle inner circumferential side. For this reason, it is possible for the rotary head 70 to prevent generation of the updraft and prevent winding up of dirt and dust. In particular, since the rotary head 70 is provided with the annular wall section 78 such that the outer wall surface 78*a* is in the vicinity of the plurality of suction nozzles 71, it is possible to increase an effect of suppressing pressure reduction on the nozzle inner circumferential side. Note that, in the present embodiment, the cylindrical fluorescent member 76 is also provided, but the fluorescent member 76 is not able to exhibit the effects as exhibited by the annular wall section 78 since the outer diameter Dr is small in comparison to the outer diameter Dp of the annular wall section 78 and a region in which the suction nozzle 71 is disposed is separated. In addition, when the rotating body 74 is rotated, the annular wall section 78 is also rotated, but the reduction in pressure on the nozzle inner circumferential side caused by the rotation is not greatly reduced. This reason being, since the annular wall section 78 is a cylindrical member and the inner wall surface is a smooth curved surface that is not uneven, rotational flow tends not to be generated even if the annular wall section 78 is rotated.

Figure 5:
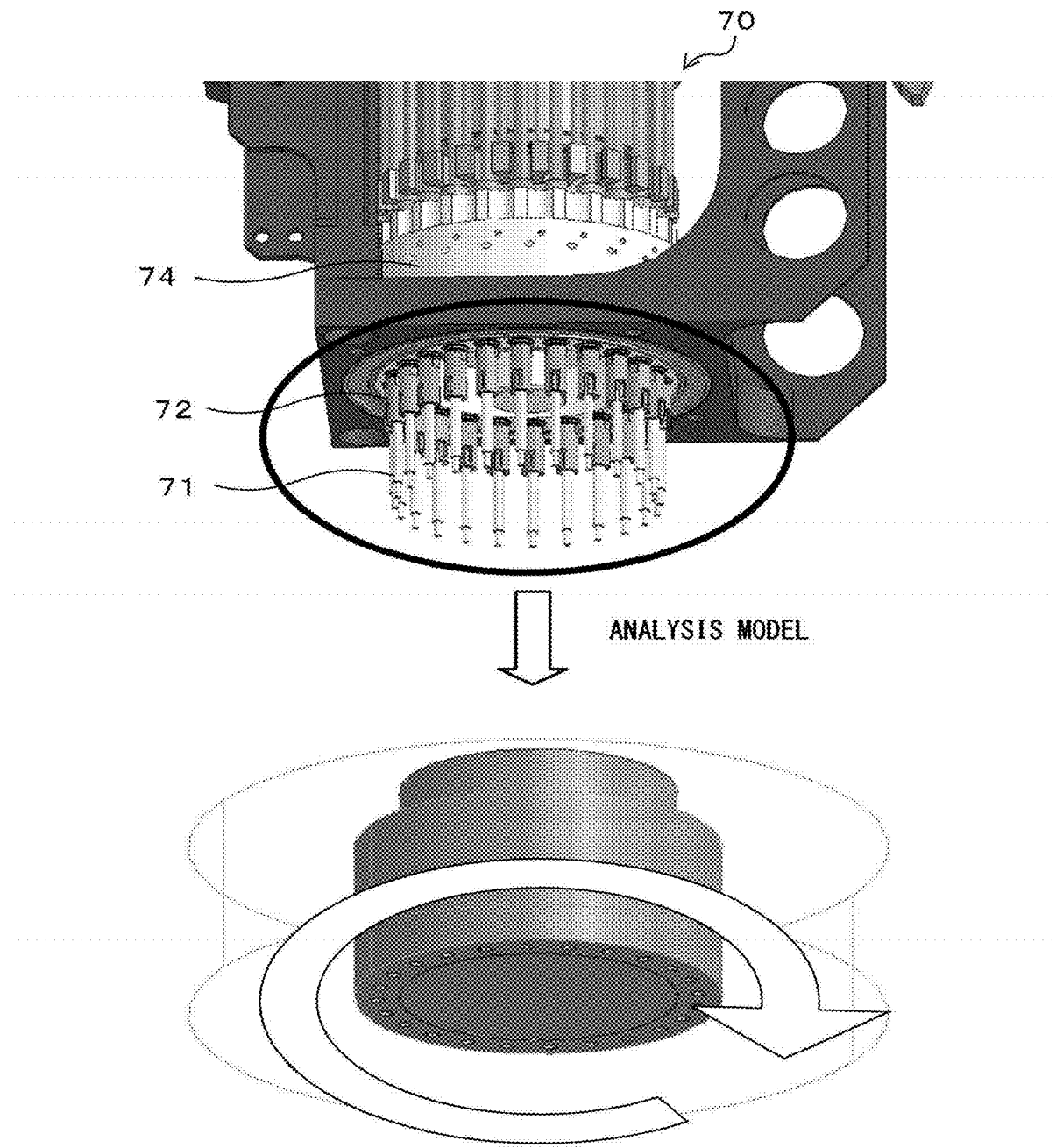
FIG. 5 is an explanatory diagram illustrating an analysis model of a simulation.

Here, an effect of suppressing pressure reduction on the nozzle inner circumferential side by providing the annular wall section 78 is described concerning a result which is confirmed by a simulation. FIG. 5 is an explanatory diagram of an analysis model of a simulation. As exemplified, the analysis model of the simulation is created by extracting a liquid region that has a region in which the suction nozzle 71 is disposed and a region on the nozzle inner circumferential side, and dividing into a plurality of elements in a mesh shape which is not illustrated in the drawings. The analysis model omits the fluorescent member 76, and a model is created in which the annular wall section 78 is not present as a comparative example to a model in which the annular wall section 78 is present as in the present embodiment. Then, under a simulation condition that corresponds to a rotation condition of the rotating body 74, pressure is determined by calculation while the each element is deformed by rotation, movement, or the like. Note that, the simulation condition sets angular velocity of the rotating body 74 to 52.36 rad/s, a simulation period of 0.7 s, and a time step that is a calculation interval of 0.0033 s.

Figure 6:
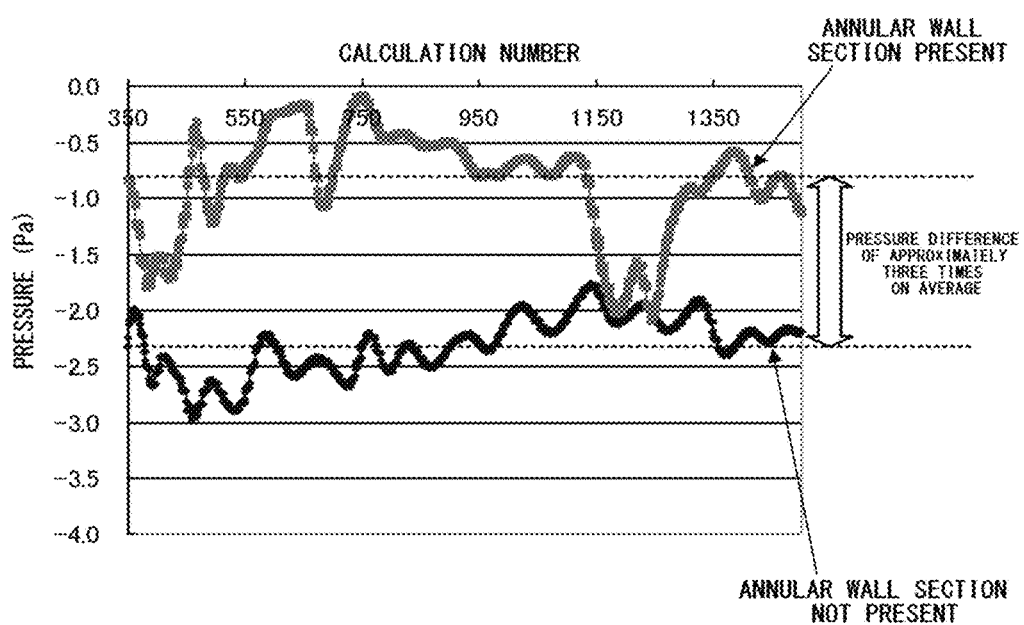
FIG. 6 is an explanatory diagram illustrating a result of pressure variation in a simulation.

FIG. 6 is an explanatory diagram illustrating a result of pressure variation in a simulation. As exemplified, the model in which the annular wall section 78 is not present results in great reduction in pressure in comparison to the model in which the annular wall section 78 is present. In detail, in the model in which the annular wall section 78 is not present, there is a pressure reduction of approximately 2.3 Pa on average with respect to atmospheric pressure on the nozzle inner circumferential side, and in the model in which the annular wall section 78 is present, there is a pressure reduction of approximately 0.9 Pa on average with respect to atmospheric pressure on the nozzle inner circumferential side. That is, in the comparative example in which the annular wall section 78 is not present, a pressure reduction of approximately 2.5 times is generated on average on the nozzle inner circumferential side in comparison to the embodiment in which the annular wall section 78 is present. In addition, FIGS. 7A and 7B are explanatory diagrams illustrating an example of pressure distribution in a simulation. FIGS. 7A and 7B illustrate reduction of pressure by the amount of a dark colored part. In the model in which the annular wall section 78 is not present (FIG. 7A), a plurality of air flows are generated along a set direction on the nozzle inner circumferential side, and as a result, air flow is generated so as to flow in whirls. In addition, the pressure on the nozzle inner circumferential side is entirely reduced, and a location is also generated at which pressure is partially and significantly reduced. Meanwhile, in the model in which the annular wall section 78 is present (FIG. 7B), since influence of rotational movement of the suction nozzle 71 is blocked by the annular wall section 78, air flow is not generated along the set direction on the nozzle inner circumferential side, and air flow is generated in a random direction. In addition, a location at which pressure is partially and significantly reduced is not generated, and there is a substantially uniform pressure distribution that is not greatly lowered from atmospheric pressure. As a result of simulation, an effect is substantiated in which the pressure reduction is suppressed on the nozzle inner circumferential side by providing the annular wall section 78.

Here, the correspondence relationship between constituent elements of the present embodiment and configuration elements of the present disclosure is clarified. The rotary head 70 of the present embodiment is equivalent to the rotary head of the present disclosure, the suction nozzle 71 is equivalent to the suction nozzle, the rotating body 74 is equivalent to the rotating body, and the annular wall section 78 is equivalent to the wall portion. In addition, the fluorescent member 76 is equivalent to the background member. In addition, the component supply device 20 is equivalent to the component supply device, and the moving mechanism 50 is equivalent to the movement device.

The component mounting device 10 in the present embodiment described above is provided with the rotary head 70 to which the plurality of suction nozzles 71 are attached and the annular wall section 78 is attached to the lower surface 74*a* of the rotating body 74 so as to be in the vicinity of the plurality of suction nozzles 71, therefore it is possible to suppress reduction of pressure on the nozzle inner circumferential side when the plurality of suction nozzles 71 are revolved. For this reason, it is possible for the rotary head 70 to suppress generation of updraft toward the rotating body 74 and prevent winding up of dirt and dust. In addition, when the rotary head 70 is moved from the suction position to the mounting position, it is possible to prevent dispersal of wound up dirt or dust within the component mounting device 10. As a result, the component mounting device 10 prevents suction of the dirt and dust to the component or the board S and the suction nozzle 71 or the fiducial mark 74*b*, and it is possible to appropriately perform mounting of the component.

In addition, in the annular wall section 78, a height from the lower surface 74*a* of the rotating body 74 is formed with a height at which the tip end of the suction nozzle 71 is not exceeded, therefore it is possible to further suppress the generation of the updraft due to the outer wall surface 78*a* is as close to the suction nozzle 71 as possible while preventing interference with the component that is sucked at the tip end of the suction nozzle 71. Furthermore, since the annular wall section 78 is a cylindrical member, it is possible to easily attach the annular wall section 78 to the lower surface 74*a* of the rotating body 74, and it is possible to suppress influence on an operation of the rotary head 70 because the weight thereof is relatively light. Then, the annular wall section 78 has a larger outer diameter and a lower height from the lower surface 74*a* than the fluorescent member 76, therefore, it is possible to suppress influence on imaging of the suction nozzle 71 while exhibiting a suppression effect of the updraft.

Note that, needless to say, the present disclosure is not limited to the embodiments described above, and it is possible to execute various forms within the technical scope of the present disclosure.

For example, in the embodiments described above, the annular wall section 78 is configured as the cylindrical member, but is not limited thereto, and may be a wall portion formed on the inner circumferential side of the plurality of suction nozzles 71. For example, the annular wall section may be configured by a plurality of divided arc shape wall members being attached to the lower surface 74*a* of the rotating body 74.

In the embodiments described above, the annular wall section 78 is annular shaped (cylindrical shaped), but is not limited thereto, and may be an annular wall section with a polygonal shape. However, when unevenness on the inner wall surface of the annular wall section is great, since pressure reduction is caused by rotation of the annular wall section, it is preferable to smoothly set the inner wall surface with an angle (inner angle) of each polygonal vertex as large as possible.

In the embodiments described above, the fluorescent member 76 and the annular wall section 78 are separately configured as cylindrical members, but is not limited thereto, and may be configured as one cylindrical member. In this case, it is sufficient if a stepped cylindrical member is formed with the same outer diameter as the annular wall section 78 from the lower surface 74*a* of the rotating body 74 up to a portion that is close to the tip end of the suction nozzle 71, a portion of the tip is formed with the same outer diameter as the fluorescent member 76 and the fluorescent coating material is colored, and the like. By doing so, it is possible to lower the number of components.

In the embodiments described above, the head unit 60 is provided with the side camera 80, but is not limited thereto, the head unit 60 may not be provided with the side camera 80, that is, the suction nozzle 71 may not image from the side. In this case, since it is possible to omit the fluorescent member 76, the annular wall section may be provided such that height of the annular wall section 78 from the lower surface 74*a* of the rotating body 74 is set as a height that exceeds the tip end of the suction nozzle 71 and the outer wall surface 78*a* does not interfere with the suction nozzle 71 or the component. In addition, in this case, the annular wall section 78 may not be annular shaped (cylindrical shaped), may be formed in a shape in which there is a bottom section of a cylindrical shape and the like, and may be set to form the fiducial mark 74*b* on the lower surface of the bottom section and the like.

INDUSTRIAL APPLICABILITY

The present application is able to be utilized to the manufacturing industry and the like of the component mounting device.

10: component mounting device, 20: component supply device, 30: board conveyance device, 40: back-up device, 50: moving mechanism, 52:, 56: guide rail, 54: X-axis slider, 58: Y-axis slider, 60: head unit, 70: rotary head, 71: suction nozzle, 72: nozzle holder, 74: rotating body, 74a: lower surface, 74b: fiducial mark, 76: fluorescent member, 78: annular wall section, 78a: outer wall surface, 80: side camera, 82: camera main body, 84: optical system unit, 90: parts camera, 100: controller, R: rotary axis, S: board

The invention claimed is:

1. A rotary head comprising:
   a rotating body on which a plurality of suction nozzles that suck a component at a tip end are disposed in a circumferential direction, and the rotating body revolves the plurality of suction nozzles by rotation of the rotating body; and
   a wall with a wall surface along an axial direction of a rotary axis of the rotating body, and the wall is provided on a lower surface of the rotating body, wherein
   the wall surface, which is an outer surface of the wall in a direction perpendicular to the rotary axis, is provided inward from an inner circumferential side of the plurality of suction nozzles, such that the wall suppresses a reduction in pressure on the inner circumferential side of the plurality of suction nozzles caused by a revolving of the suction nozzles.

2. The rotary head according to claim 1,
   wherein the wall includes a height from the lower surface of the rotating body that does not exceed the tip end of the suction nozzles.

3. The rotary head according to claim 1,
   wherein the wall is a cylindrical wall and is attached to the lower surface of the rotating body, and the cylindrical wall includes an axis that is the same as the rotary axis of the rotating body.

4. The rotary head according to claim 1, further comprising:
   a background structure with a cylindrical shape that is a background when the tip end of at least one of the suction nozzles is imaged from a side, and the background structure is attached to the lower surface of the rotating body, wherein
   the wall includes a height from the lower surface of the rotating body that is less than a height of the background structure, and the wall includes a diameter that is larger than an outer diameter of the background structure.

5. The rotary head according to claim 4,
   wherein the background structure includes a fluorescent coating material.

6. The rotary head according to claim 1,
   wherein the wall is rotatable with the rotating body.

7. The rotary head according to claim 1,
   wherein the outer surface of the wall curves in a direction that extends around the rotary axis of the rotating body.

8. The rotary head according to claim 1,
   wherein a diameter across the outer surface of the wall is equal to 70% or more of a distance between diametrically opposed suction nozzles of the plurality of suction nozzles.

9. The rotary head according to claim 1,
   wherein the lower surface of the rotating body includes a fiducial mark.

* * * * *